United States Patent
Novogran et al.

(10) Patent No.: US 11,163,679 B2
(45) Date of Patent: Nov. 2, 2021

(54) GARBAGE COLLECTION STRATEGY FOR MEMORY SYSTEM AND METHOD OF EXECUTING SUCH GARBAGE COLLECTION

(71) Applicant: SK hynix Inc., Gyeonggi-do (KR)

(72) Inventors: Igor Novogran, Minsk (BY); Andrei Konan, Minsk (BY)

(73) Assignee: SK hynix Inc., Gyeonggi-do (KR)

( * ) Notice: Subject to any disclaimer, the term of this patent is extended or adjusted under 35 U.S.C. 154(b) by 218 days.

(21) Appl. No.: 16/374,066

(22) Filed: Apr. 3, 2019

(65) Prior Publication Data

US 2019/0310936 A1 Oct. 10, 2019

Related U.S. Application Data

(60) Provisional application No. 62/652,587, filed on Apr. 4, 2018.

(51) Int. Cl.
*G06F 12/02* (2006.01)
*G06F 12/0804* (2016.01)

(52) U.S. Cl.
CPC ...... *G06F 12/0253* (2013.01); *G06F 12/0804* (2013.01); *G06F 2212/1032* (2013.01); *G06F 2212/7205* (2013.01)

(58) Field of Classification Search
CPC ............. G06F 12/0253; G06F 12/0246; G06F 3/0659; G06F 3/0679
USPC ........................................................ 711/103
See application file for complete search history.

(56) References Cited

U.S. PATENT DOCUMENTS

| | | | | |
|---|---|---|---|---|
| 2006/0259718 A1* | 11/2006 | Paley | ................... | G06F 11/1072 711/159 |
| 2009/0193184 A1* | 7/2009 | Yu | ........................ | G11C 11/5678 711/103 |
| 2009/0327591 A1* | 12/2009 | Moshayedi | ......... | G06F 11/1441 711/103 |
| 2010/0138592 A1* | 6/2010 | Cheon | ................. | G06F 12/0246 711/103 |
| 2010/0169543 A1* | 7/2010 | Edgington | .......... | G06F 12/1009 711/103 |
| 2013/0151892 A1 | 6/2013 | Huang et al. | | |
| 2013/0322169 A1* | 12/2013 | Goss | ........................ | G06F 12/00 365/185.02 |
| 2014/0006683 A1* | 1/2014 | Ratn | .................... | G06F 11/1446 711/102 |

(Continued)

*Primary Examiner* — Titus Wong
(74) *Attorney, Agent, or Firm* — IP & T Group LLP

(57) ABSTRACT

Memory systems and components thereof execute an improved garbage collection (GC) strategy in the case of multiple sudden power offs (SPOs). Such a memory system comprises a memory device including single-level cell (SLC) memory blocks grouped into super blocks (SLC SBs) and multi-level cell (MLC) memory blocks grouped into SBs (MLC SBs); and a memory controller to execute a flash translation layer (FTL) to perform a garbage collection (GC) operation. The memory controller executes the GC operation after a sudden power off (SPO) by determining each MLC SB with user data opened before the SPO to be an unsafe super block (UB), copying data from pages in a select one of the UBs to pages in the SLC SBs, and copying data from the pages in the SLC SBs to pages in a select MLC SB not determined to be a UB.

17 Claims, 13 Drawing Sheets

(56) References Cited

U.S. PATENT DOCUMENTS

| | | | |
|---|---|---|---|
| 2015/0103599 A1* | 4/2015 | Kim | G11C 11/5628 |
| | | | 365/185.12 |
| 2016/0268000 A1* | 9/2016 | Thompson | G11C 11/5635 |
| 2016/0284393 A1 | 9/2016 | Ramalingam | |
| 2017/0277245 A1* | 9/2017 | Paley | G06F 1/30 |

* cited by examiner

GARBAGE COLLECTION STRATEGY FOR MEMORY SYSTEM AND METHOD OF EXECUTING SUCH GARBAGE COLLECTION

CROSS-REFERENCE TO RELATED APPLICATION

This application claims the benefit of U.S. Provisional Application No. 62/652,587, filed Apr. 4, 2018, the entire content of which is incorporated herein by reference.

BACKGROUND

1. Field

Embodiments of the present disclosure relate to a garbage collection strategy for a memory system, particularly a flash-based memory system, and method of executing such garbage collection.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD may include flash memory components and a controller, which includes the electronics that bridge the flash memory components to the SSD input/output (I/O) Interfaces. The SSD controller may include an embedded processor that executes functional components such as firmware. The SSD functional components are typically device specific, and in most cases, can be updated.

The two main types of flash memories are named after the NAND and NOR logic gates. The individual flash memory cells exhibit internal characteristics similar to those of their corresponding gates. The NAND-type flash memory may be written to and read from in blocks (or pages) which are generally much smaller than the entire memory space. The NOR-type flash allows a single machine word (byte) to be written to an erased location or read independently. The NAND-type flash memory operates primarily in memory cards, USB flash drives, solid-state drives (SSDs), and similar products, for general storage and transfer of data.

Flash-based storage, e.g., NAND-type flash memory systems, include a flash translation layer (FTL), which is firmware, one role of which is to perform address translation between logical addresses and physical addresses of the memory device, i.e., logical-to-physical (L2P) mapping, also known as logical block addressing (LBA). The FTL also performs garbage collection (GC), which is a process to ensure that there are a sufficient number of free pages for write operations. The GC process makes a free region available in the memory device by, e.g., selecting a super block (SB), moving data of valid pages to the SB, and erasing physical blocks from the SB. To satisfy quality-of-service (QoS) requirements, a GC trigger and throttling algorithm is typically implemented in FTL. The thrust of the algorithm is to divide the GC work into small portions to find a balance between host and GC write operations.

From time to time, storage devices are subject to sudden power off (SPO), at which time power supply is abruptly cut-off or interrupted. Thus, storage devices typically have a sudden power off recovery (SPOR) method to preserve data consistency and integrity. In the case of a NAND-type flash storage, there are several considerations for the SPOR method. One such consideration involves GC.

In this context, embodiments of the present invention arise.

SUMMARY

Aspects of the present invention include memory systems, particularly flash-based NAND-type memory systems. According to one aspect, a memory system comprises a memory device including single-level cell (SLC) memory blocks and multi-level cell (MLC) memory blocks, each of the memory blocks including pages, at least some of the SLC memory blocks being grouped into super blocks (SLC SBs) and at least some of the MLC memory blocks being grouped into super blocks (MLC SBs); and a memory controller configured to execute a flash translation layer (FTL) to perform operations including a garbage collection (GC) operation. The memory controller executes the GC operation after a sudden power off (SPO) by determining each MLC SB with user data opened before the SPO to be an unsafe super block (UB), copying data from pages in a select one of the UBs to pages in the SLC SBs, and copying data from the pages in the SLC SBs to pages in a select MLC SB not determined to be a UB.

Another aspect of the present invention includes methods of calling a GC operation, which may be performed by memory controllers and components thereof. In this regard, another aspect of the present invention entails a method of performing a garbage collection (GC) operation on a memory system that includes a memory device including single-level cell (SLC) memory blocks and multi-level cell (MLC) memory blocks, each of the memory blocks including pages, at least some of the SLC memory blocks being grouped into SLC super blocks (SBs) and at least some of the MLC memory blocks being grouped into MLC SBs. The method comprises determining each MLC SB with user data opened before a first SPO of multiple SPOs to be an unsafe SB (UB); copying data from pages in a select one of the UBs to pages in at least some of the SLC SBs during each of multiple rebuild time intervals (RTIs) after the first and subsequent SPOs respectively until the select UB contains only invalid data, each RTI being a set time starting from a power-on following the corresponding SPO; erasing the invalid data in the select UB; and copying data from the pages in the SLC SBs, to which data was copied from the select UB, to pages in a select MLC SB not determined to be a UB until the select MLC SB is full.

Additional aspects of the present invention will become apparent from the following description.

DETAILED DESCRIPTION

Figure 1:
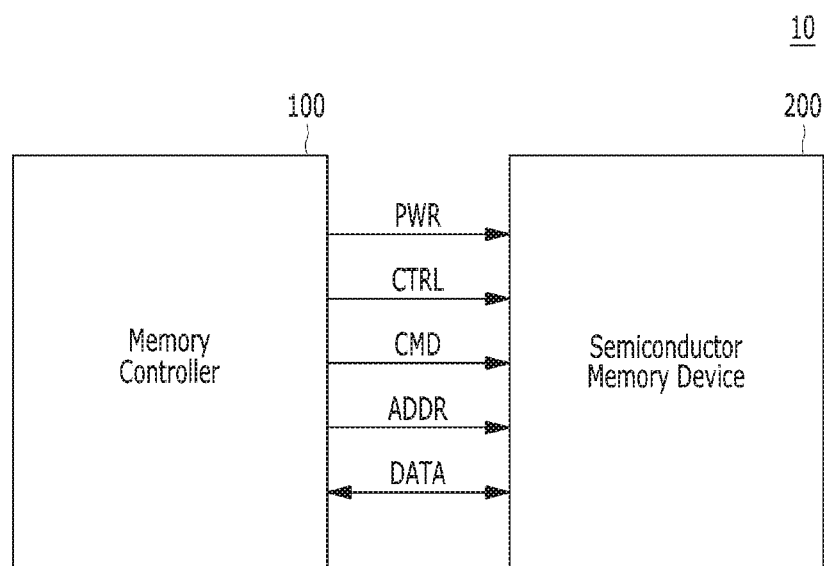
FIG. 1 is a block diagram illustrating a memory system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram schematically illustrating a memory system in accordance with an embodiment of the present invention.

Referring FIG. 1, the memory system 10 may include a memory controller 100 and a semiconductor memory device 200, which may represent more than one such device. The semiconductor memory device(s) 200 are preferably flash memory device(s), particularly of the NAND-type.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output (I/O) lines. The semiconductor memory device 200 may receive power PWR through a power line and a control signal CTRL through a control line. The control signal CTRL may include a command latch enable (CLE) signal, an address latch enable (ALE) signal, a chip enable (CE) signal, a write enable (WE) signal, a read enable (RE) signal, and the like.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

In another embodiment, the memory system 10 may be provided as one of various components in an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

Figure 2:
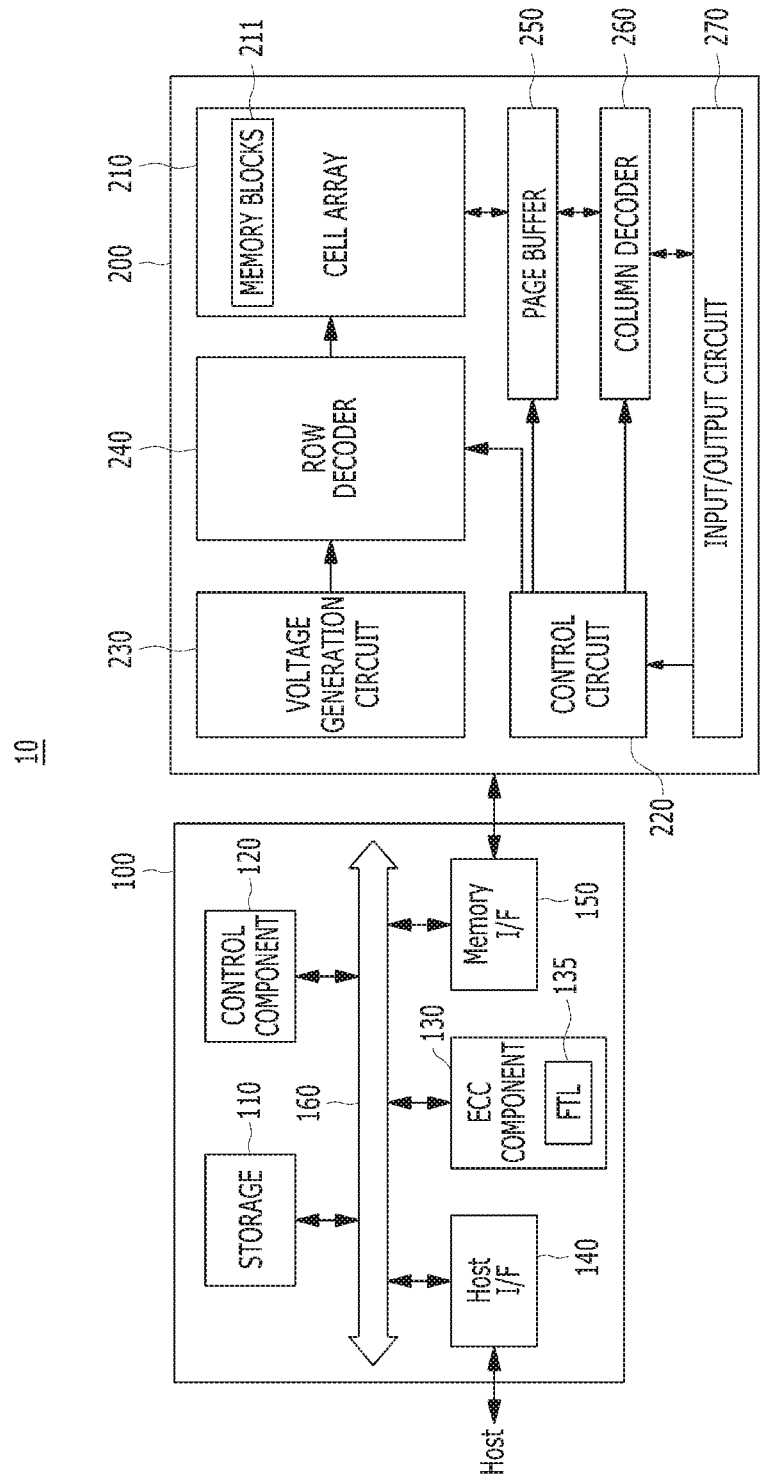
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, and/or a digital video recorder and a digital video player. In some embodiments, the host device may include a portable electronic device such as a mobile phone, a smart phone, an e-book, an MP3 player, a portable multimedia player (PMP), and/or a portable game player.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL) 135, to control general operations of the memory system 10. For example, the FTL 135 may perform operations such as logical-to-physical (L2P) mapping, wear leveling, garbage collection (GC), and/or bad block handling. The FTL 135 may be implemented, as a firmware, in the control component 120 or in the controller 100. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

The ECC component 130 may perform an error correction operation based on a coded modulation, such as a low-density parity-check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a block coded modulation (BCM). The ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component or CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer (array) 250, which may be in the form of an array of page buffers, a column decoder 260, and an input/output circuit 270. The memory cell array 210 may include a plurality of memory blocks 211 which may store data. Subsets of the memory blocks may be grouped into respective super blocks (SBs) for certain operations. SBs and their use in the context of embodiments of the present invention are described in more detail below.

The voltage generation circuit 230, the row decoder 240, the page buffer 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks.

Figure 3:
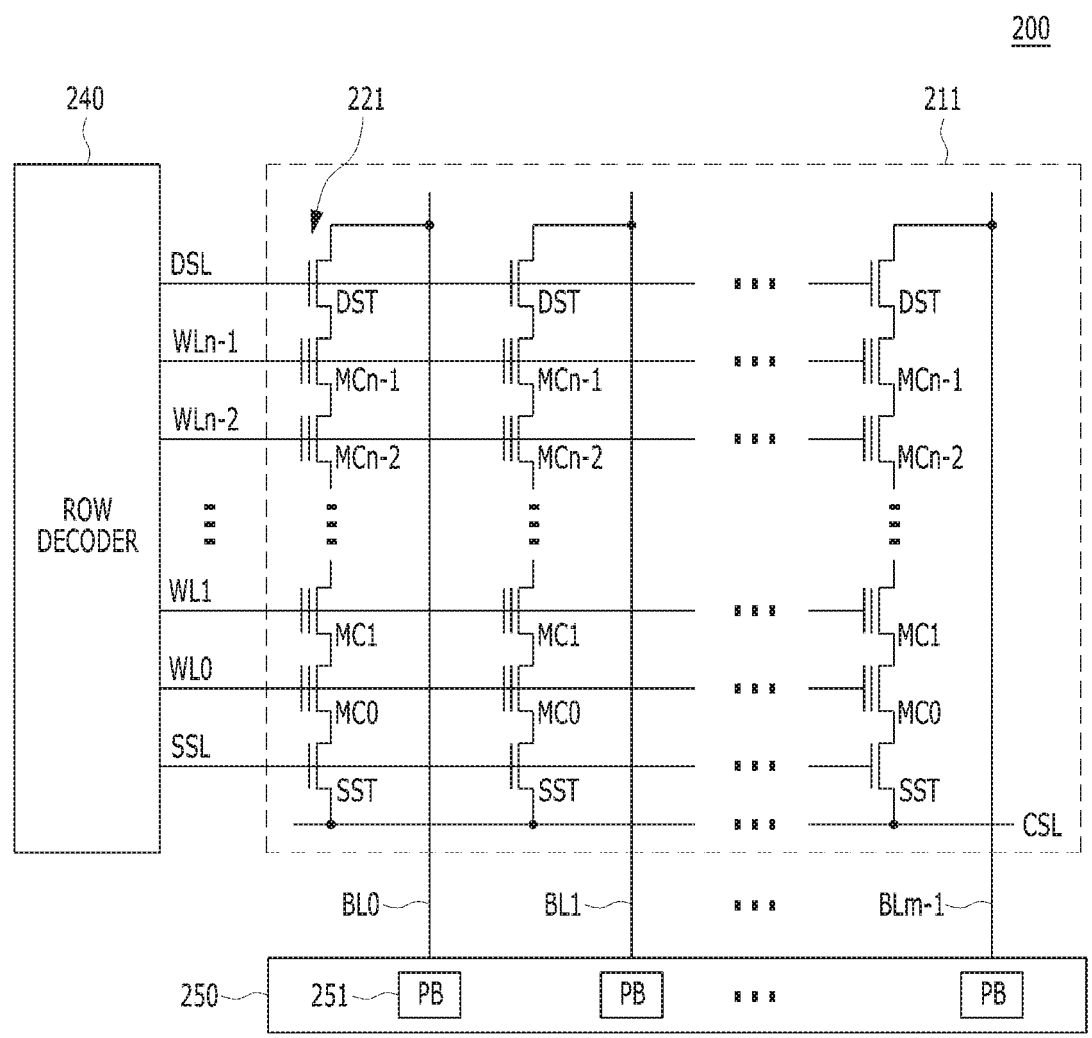
FIG. 3 is a circuit diagram illustrating a memory block of a memory device of a memory system in accordance with an embodiment of the present invention.

The page buffer 250 may be in electrical communication with the memory cell array 210 through bit lines BL (shown in FIG. 3). The page buffer 250 may pre-charge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250, and may also exchange data with the input/output circuit 270.

The input/output circuit 270 may transmit to the control circuit 220 a command and an address, received from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 200 shown in FIG. 2.

Referring to FIG. 3, the exemplary memory block 211 may include a plurality of word lines WL0 to WLn−1, a drain select line DSL and a source select line SSL coupled to the row decoder 240. These lines may be arranged in parallel with the plurality of word lines between the DSL and SSL.

The exemplary memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a multi-level cell (MLC) storing data information of multiple bits.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

As previously noted, the page buffer 250 may be in the form of a page buffer array including a plurality of page buffers 251 that are coupled to the bit lines BL0 to BLm−1. The page buffers 251 may operate in response to page buffer control signals. For example, the page buffers 251 my temporarily store data received through the bit lines BL0 to BLm−1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

As previously noted, flash storage devices are subjected from time-to-time to sudden power off (SPO), and thus should have a sudden power off recovery (SPOR) method to implement in such situation. In the case of NAND-type flash memory devices, there are several basic requirements for the SPOR method. (1) The state of the mapping table within the controller 100 and some FTL metadata before SPO must be restored on SPOR. (2) Write operations to the super block (SB) last-opened before SPO are prohibited; the data from that SB must be copied to a new SB. (3) SPOR time is limited. FTL 135 is to start execution of the host write commands after a certain rebuild time interval (RTI) from power-on, e.g., SATA enterprise SSD RTI is equal to ~10 s.

To satisfy the first requirement, the FTL 135 periodically stores its metadata to the NAND memory device 200. Since it is not possible to store metadata after each change, the loaded version of metadata may not be fully consistent after an SPO. For critical metadata, e.g., mapping table, the FTL 135 provides methods of recovering such metadata loaded during SPOR. However, for non-critical metadata, it is acceptable to load only its last-stored version, with the FTL 135 losing some information. For example, the FTL 135 flashes read counters after each set number of read operations (TH). If SPO occurs when the counter of all read operations is less than TH, the FTL 135 loses the actual version of the SB's read counters stored in RAM. That is one of the reasons for the second requirement of the SPOR method.

To satisfy the second requirement, the FTL 135 calls a GC operation for the last-opened SB. However, due to time constraints of the third requirement (described below), it is not always possible to finish the GC operation in time. Therefore, the FTL 135 allows the execution of host write commands and continues copying data from the SB last opened before SPO in the background. However, in case of multiple SPOs when there is not enough time for the GC operation to finish the background work, this strategy does not prevent device degradation (e.g., the memory device runs out of free SBs) and corruption of user data in the case of sequential SPOs. The worst case scenario is the occurrence of an SPO after execution of each host write operation.

Embodiments of the present invention provide a GC operation strategy that maintains consistency of user data and prevents device degradation in the case of sequential SPOs, even in the worst case scenario.

In modern flashed-based storage devices, two types of physical blocks are used: single level cell (SLC) memory blocks and multi-level cell memory blocks. An SLC memory block has memory cells, each capable of storing a single bit. An MLC memory block has memory cells, each capable of storing multiple (2 or more) bits. A memory block with cells each storing 3 bits is sometimes referred to as a triple level cell (TLC) memory block, and a memory block with cells each storing 4 bits is sometimes referred to as a quad level cell (QLC) memory block. Herein, MLC memory blocks encompasses TLC and QLC memory blocks. Likewise, MLC SBs encompasses TLC SBs and QLC SBs.

User data is usually stored in MLC physical blocks. The SLC blocks are more reliable; hence the FTL 135 uses SLC physical blocks for critical data, e.g., its metadata, FW image, etc. Also, the SLC blocks can be used as temporary storage for user data (e.g., SLC-cache).

In the context of the GC operation strategy described below, MLC SBs opened before the first SPO are defined as unsafe blocks (UBs).

For the GC strategy, it is important to provide the possibility to continue writing to an SLC block, which has not been closed before SPO, even if the host reads data from the SLC blocks. First of all, the read disturbance threshold of an SLC block is much higher than for an MLC block. In addition, in the case when the GC strategy on SPOR has a finite number of steps (depends on the size of data in UBs, the size of SLC-cache, etc.), in the worst case scenario, the FTL 135 can calculate the read throttling level for the SLC blocks. Using this read throttling level, the FTL 135 can ensure that the used SLC blocks do not reach their read disturbance threshold for the worst case scenario when there is no possibility to store read counters.

The GC operation strategy, according to embodiments of the present invention, is based on the usage of the SLC physical blocks as temporary storage for user data from UBs. This helps to avoid starvation or depletion of SBs in the case of multiple SPOs. New user data is also written to the SLC blocks. A suitable GC trigger and throttling algorithm is used to provide enough space for data from UBs and new data from the host in the SLC area of the cell array 210. The GC trigger and throttling algorithm or policy is set, at least in part, based on the specifications for the particular memory system and QoS requirements.

Generally, the GC strategy of the present invention includes two steps or stages: (1) copying data from UBs to the SLC area, e.g., pages in blocks of SLC SBs; and (2) copying data from the SLC area to new MLC SBs. In either stage, if new data is received from the host, that new data is written to the SLC area.

During RTI, the FTL 135 first loads and recovers critical metadata, but the situation ensures that there is time for GC of UBs. Because of this, in case of multiple SPOs, all data from UBs will be copied to the SLC area at the first stage. Between SPOs, the host can read data from UBs and SLC area, and the FTL 135 continues writing data to the SLC blocks after the next SPO, even those that have not been closed before an SPO.

At the second stage, the FTL 135 manages free space for new host data in the SLC area using GC throttling. There are two copies of data on the NAND memory device 200; hence, the FTL 135 ensures that there are no host reads from the opened MLC blocks. In this case, even after a new SPO, the FTL 135 can continue writing data to the MLC blocks. Taking into account that the FTL 135 copies more data to MLC blocks than the host writes to SLC blocks, the total number of steps is finite.

Figure 4:
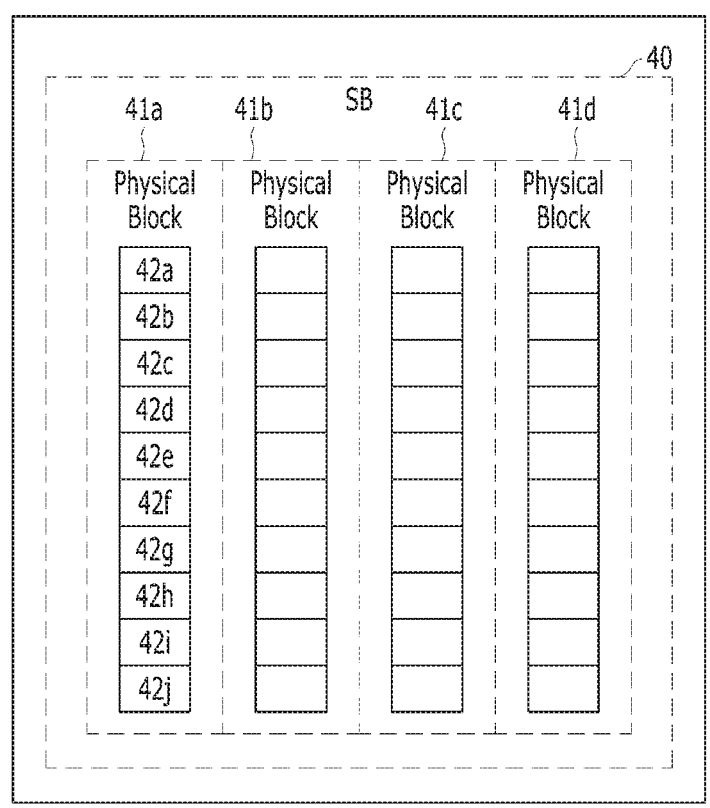
FIG. 4 is a diagram illustrating a super block (SB) structure in accordance with an embodiment of the present invention.

In the context of a flash-based storage device that contains two types of memory blocks: SLC blocks and MLC memory blocks, user data is stored in the MLC blocks, and an MLC physical page is twice as large as an SLC physical page, a super block (SB) 40 may have a structure as shown in FIG. 4. That is, in the illustrated embodiment, SB 40 includes four (4) physical blocks 41*a*, 41*b*, 41*c* and 41*d*, and each physical block has ten (10) pages 42*a*-42*j*. For clarity, only the pages in the physical block 41*a* are labeled. Similarly, in SBs illustrated in other figures, only the pages in the first physical block are labeled.

Figure 5:
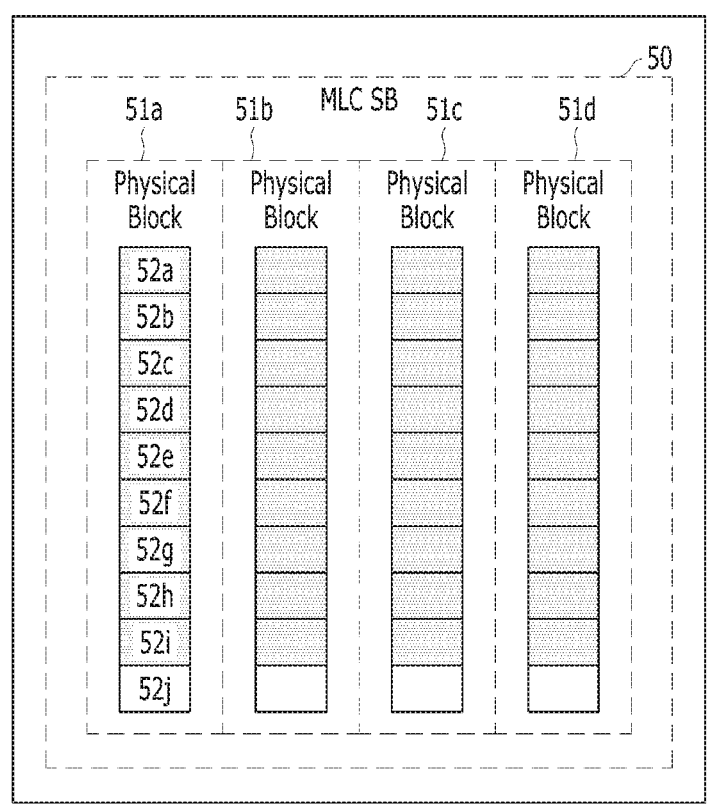
FIG. 5 is a diagram illustrating a state of a multi-level cell super block (MLC SB) before the first sudden power off (SPO) in accordance with an embodiment of the present invention.

By way of example, the first SPO occurs when an MLC SB 50, shown in FIG. 5, has been almost filled with valid user data. Specifically, pages 52*a*-52*i* in each of the 4 physical blocks 51*a*, 51*b*, 51*c* and 51*d* of MLC SB 50 have been written to with valid user data. The last page 52*j* in each of the physical blocks 51*a*-51*d* has not been written to.

To more easily visualize the pages to which valid user data has been written, such pages are shown with light dots in FIG. 4 and in FIGS. 5-11.

Figure 6:
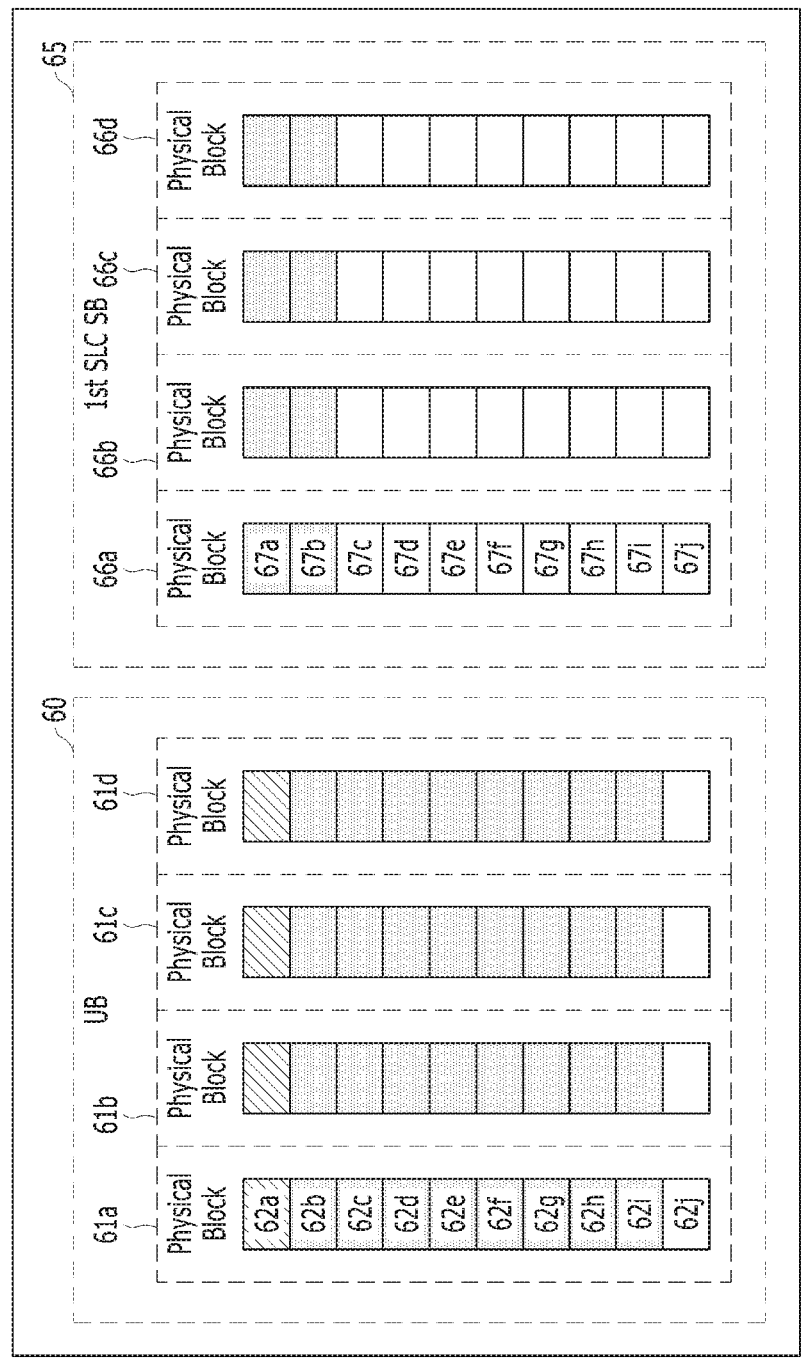
FIG. 6 is a diagram illustrating the state of the MLC SB of FIG. 5 after power-on and at the end of a rebuild time interval (RTI), the MLC SB being marked as an unsafe block (UB), and the state of a first single-level cell super block (SLC SB) to which certain pages of the UB are copied, in accordance with an embodiment of the present invention.

After power-on, the FTL 135 marks MLC SB 50 as an unsafe block (UB) 60, which is shown in FIG. 6. Note that the structure of UB 60 is the same as that of MLC SB 50. That is, UB 60 has 4 physical blocks 61*a*-61*d*, each with 10 pages 62*a*-62*j*.

Write operations to UB 60 are prohibited because the exact number of read operations from UB 60 is unknown. The FTL 135 calls a GC operation to copy data from UB 60 to a $1^{st}$ SLC SB 65 also shown in FIG. 6. Note here that SLC SB 65 also has 4 physical blocks 66*a*-66*d*, each with 10 pages 67*a*-67*j*.

Assume that during RTI, the FTL 135 can copy only one physical page from each UB physical block to SLC SB 65. Given the size difference between an MLC page and an SLC page, two SLC pages are required to copy data from one MLC page. FIG. 6 shows the result of such copy operation. That is, FIG. 6 shows the states of UB 60 and first SLC SB 65 at the end of RTI. The first pages 62*a* in each of the physical blocks 61*a*-61*d* of UB 60 are invalidated pages, and the first and second pages 67*a*, 67*b* of each of the physical blocks 66*a*-66*d* of SLC SB 65 are written pages, while the remaining pages 67*c*-67*j* have not been written to. The other pages of UB 60, i.e., pages 62*b*-62*j*, remain as described with respect to their respective counterpart pages 52*b*-52*j* of MLC SB 50 shown in FIG. 5.

Figure 7:
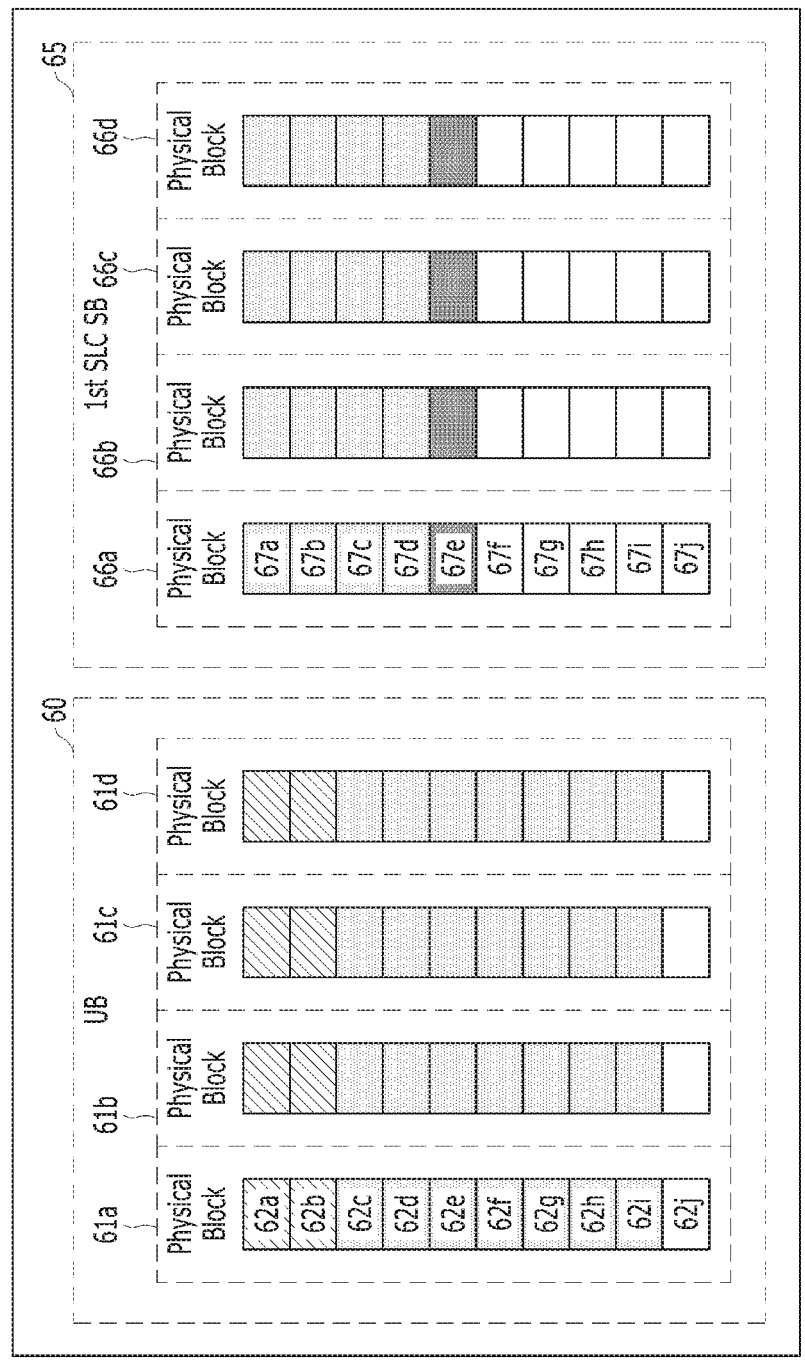
FIG. 7 is a diagram illustrating the states of the UB and the SLC SB of FIG. 6 before the second SPO, in accordance with an embodiment of the present invention.
Figure 8:
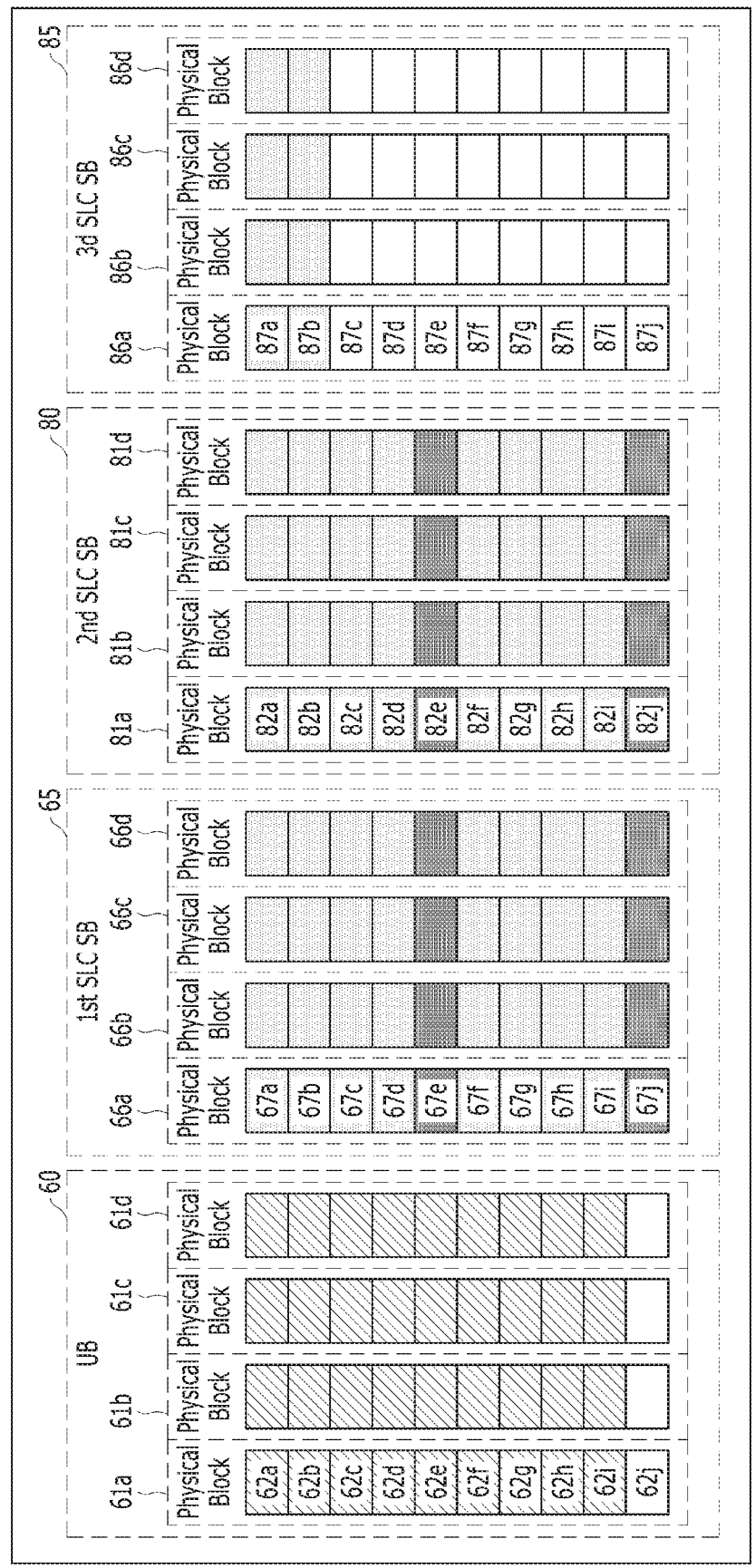
FIG. 8 is a diagram illustrating the states of super blocks, including the UB and the first SLC SB, as well as second and third SLC SBs, at the end of RTI after the fifth SPO, in accordance with an embodiment of the present invention.

Invalidated pages in FIG. 6, as well as in FIGS. 7 and 8, are shown with single cross-hatching.

A GC trigger and throttling policy may be defined as follows. If a GC operation called by the FTL 135 writes four (4) SLC physical pages per block, then the host writes one SCL page per block. The GC trigger and throttling policy can be easily adjusted according to the number of UBs and the available SLC blocks and QoS requirements. Taking into account that blocks from the SB should be written in parallel, the GC writes 4*4=16 SLC pages, while the host writes 4 SLC pages. Therefore, during RTI, the GC writes eight (8) SLC pages (see FIG. 6). Hence, the GC should write the next eight (8) SLC pages to use up its quota. Assume that after the GC finishes its part of the work, the host writes four (4) SLC pages and sends several read requests to recently written data in the SLC block. The state of the SBs before the second SPO is as shown in FIG. 7.

As shown in FIG. 7, now the second pages 62b in each of the physical blocks 61a-61d of UB 60, in addition to the first pages 62a, are invalidated pages. Also, the third and fourth pages 67c, 67d in each of the physical blocks 66a-66d of SLC SB 65, in addition to the first and second pages 67a, 67b, are written pages as a result of the GC operation. The new host data is in the fifth pages 67e of each of the physical blocks 66a-66d of SLC SB 65. Other pages in both UB 60 and SLC SB 65 remain as described with respect to FIG. 6.

Pages with new host data in FIG. 7, and FIGS. 8-12, are darkened for ease of identification.

After power-on, following the second SPO, the FTL 135 continues writing data to pages of SLC SB 65 that were not closed before the second SPO. For example, the host and the FTL 135 may perform the same sequence of actions as they did between the first and second SPO, which is the same as between later adjacent SPOs. Thus, at the end of RTI after the fifth SPO, all of the user data from UB 60 will be copied into pages in blocks of SLC SBs, including $1^{st}$ SLC SB 65, as well as $2^{nd}$ and $3^{rd}$ SLC SBs 80 and 85 shown in FIG. 8.

Thus, referring to FIG. 8, pages 62a-62i of blocks 61a-61d of UB 60, to which data was written, are now invalidated. Such data has now been copied to pages of $1^{st}$ SLC SB 65, $2^{nd}$ SLC SB 80 and $3^{rd}$ SLC SB 85. All pages of $1^{st}$ SLC SB 65 now contain data, with pages 67e and 67j of blocks 66a-66d containing host data. The same is true for $2^{nd}$ SLC SB 80. That is, pages 82a-82d and 82f-82i of blocks 81a-81d of SLC SB 80 have been written to as a result of the GC operation and pages 82e and 82j of blocks 81a-81d contain host data. As for the $3^{rd}$ SLC SB 85, pages 87a and 87b of blocks 86a-86d have been written to, which pages 87c-87j of blocks 86a-86d have not been written to.

With UB 60 containing only invalid data at this point, it can be erased. This means that the first general step of the GC operation strategy is complete and the FTL 135 can start copying data from SLC SBs to MLC SBs. By way of example, the FTL 135 processes $1^{st}$ SLC SB 65 first. Also, according to embodiments of the GC strategy, if data has been copied to an MLC SB, its SLC SB version is still valid and used to satisfy host read requests. SLC SB data is invalidated only when a new MLC SB is closed.

Figure 9:
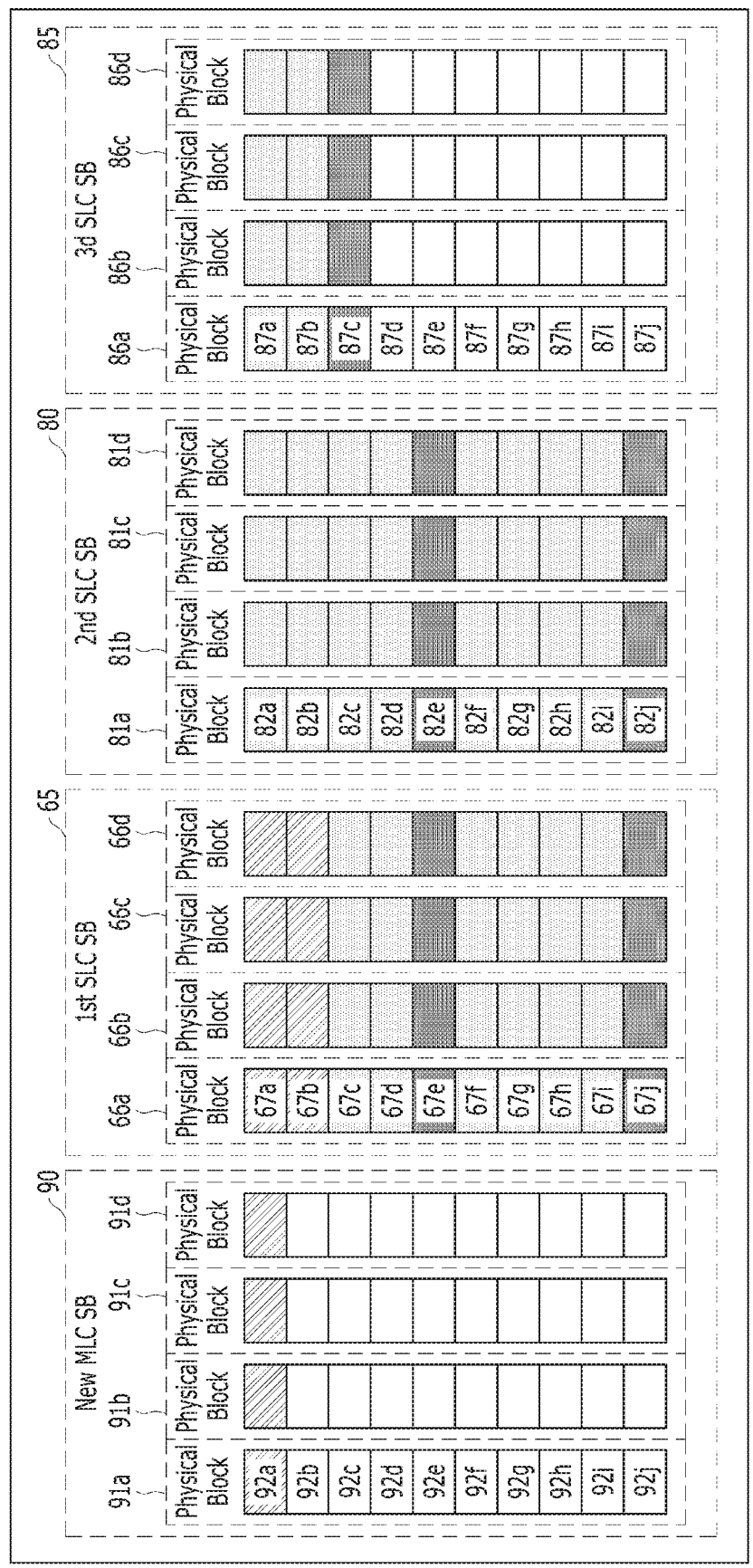
FIG. 9 is a diagram illustrating the states of the SBs before the sixth SPO in accordance with an embodiment of the present invention.

Continuing with the same sequence of actions between the FTL 135 and the host, the state of the SBs before the sixth SPO is described with respect to FIG. 9.

FIG. 9 shows a new MLC SB 90, along with $1^{st}$, $2^{nd}$ and $3^{rd}$ SLC SBs 65, 80 and 85 respectively. Data having an SLC version and an MLC version is contained in pages 92a of blocks 91a-91d of MLC SB 90 and in pages 67a and 67b of blocks 66a-66d of $1^{st}$ SLC SB 65. Host data is contained in pages 67e and 67j of blocks 66a-66d of $1^{st}$ SLC SB 65, with the remaining pages in all blocks containing data written through GC operations. As for $2^{nd}$ SLC SB 80, host data is contained in pages 82e and 82j of blocks 81a-81d, with the remaining pages in all blocks containing data written through GC operations. In $3^{rd}$ SLC SB 85, pages 87a and 87b of blocks 86a-86d have been written to, pages 87c of all blocks contain host data, and the remaining pages across all blocks are empty.

Figure 10:
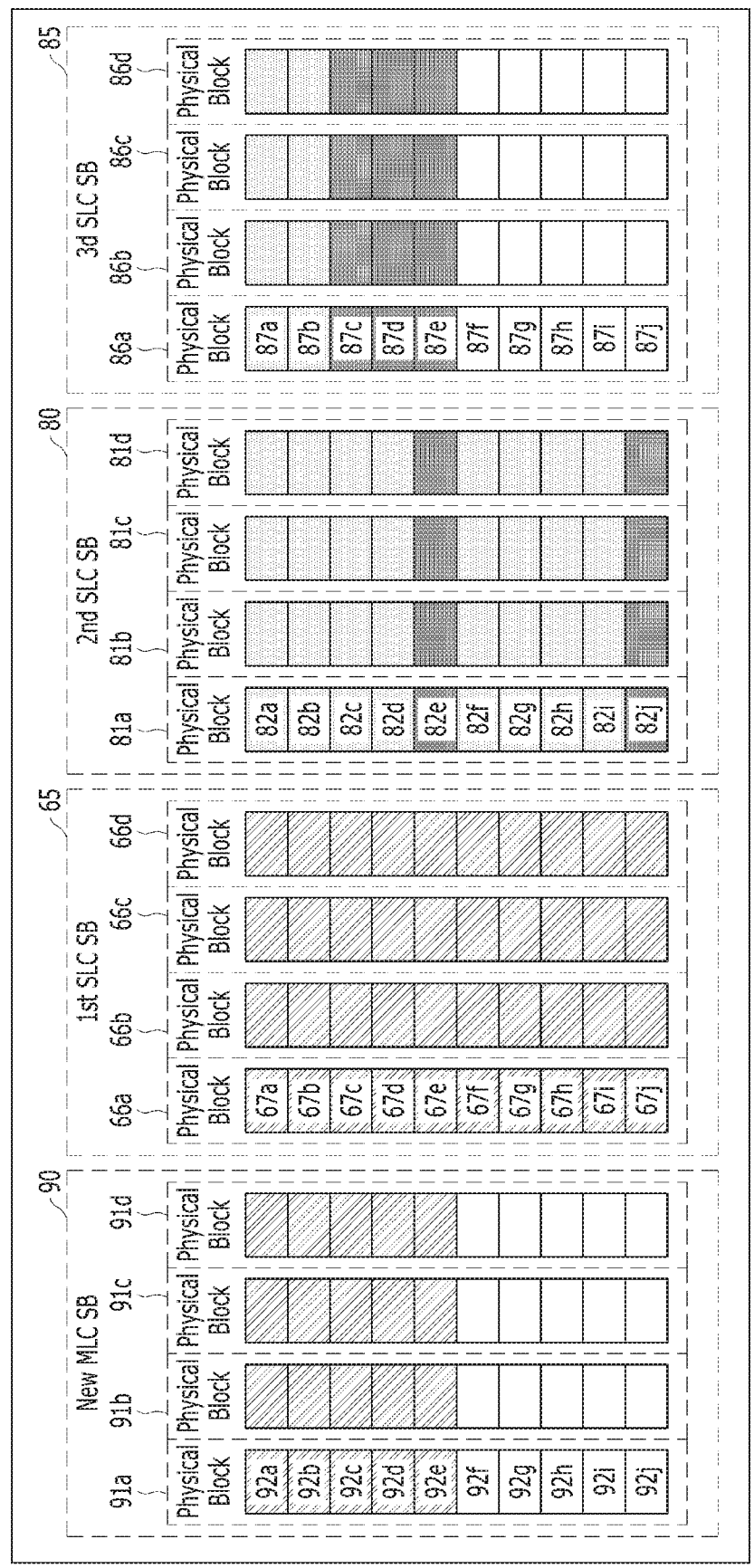
FIG. 10 is a diagram illustrating the states of the SBs before the eighth SPO in accordance with an embodiment of the present invention.
Figure 11:
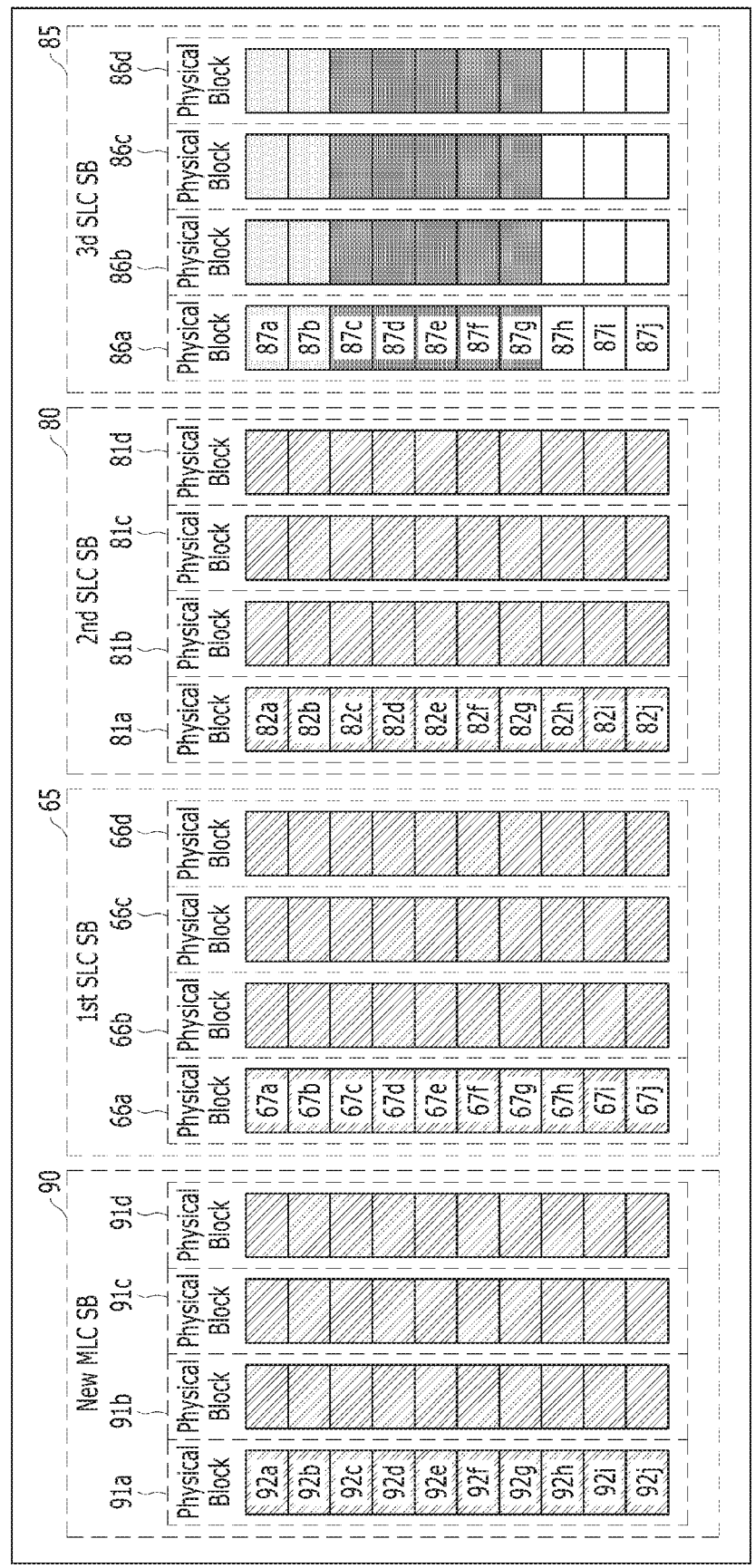
FIG. 11 is a diagram illustrating the states of the SBs at the end of RTI after the tenth SPO in accordance with an embodiment of the present invention.
Figure 12:
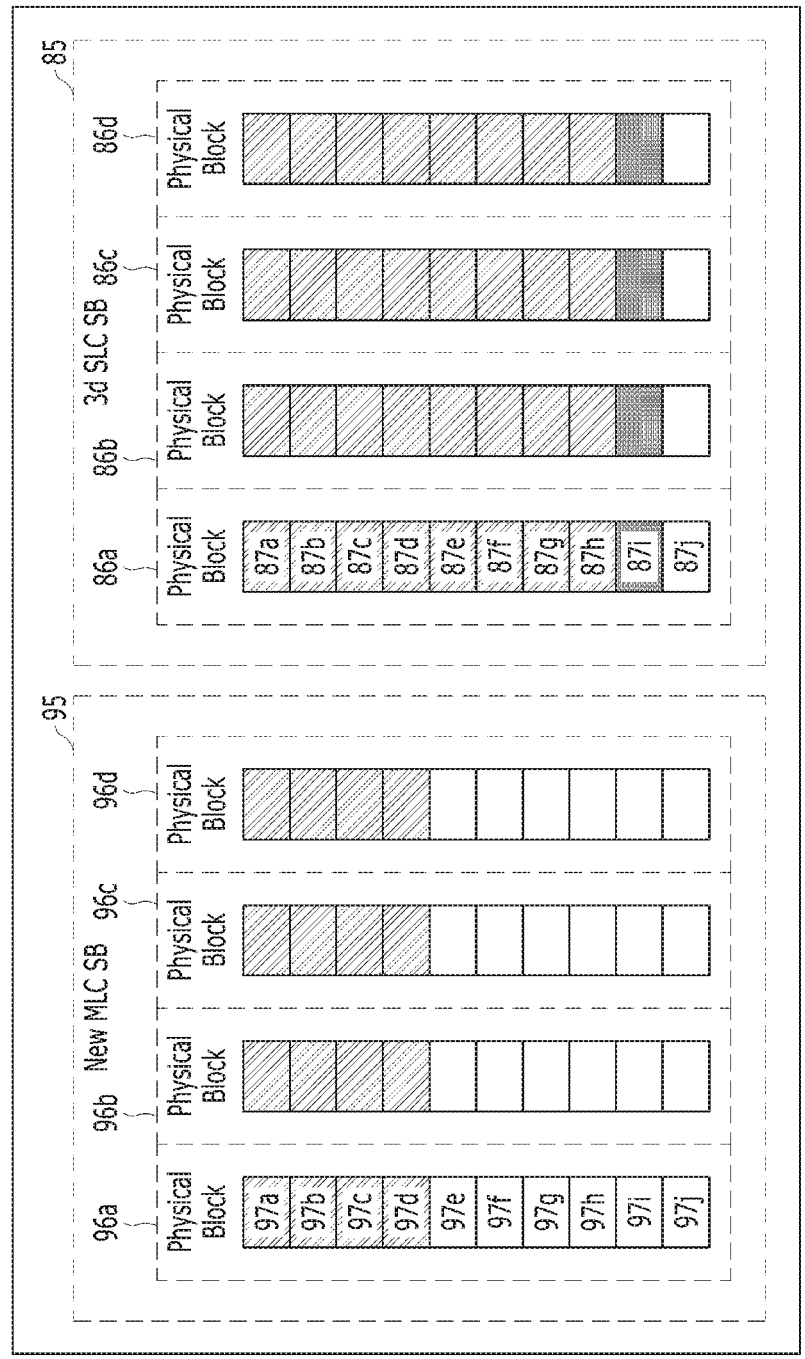
FIG. 12 is a diagram illustrating the states of the SBs at the end of RTI after the twelfth SPO in accordance with an embodiment of the present invention.

In FIG. 9, as well as in FIGS. 10-12, pages containing data having an SLC version and an MLC version are marked with double cross-hatching.

The process continues. After the sixth SPO, the FTL 135 continues writing to the MLC SB 90, because a read counter of MLC SB 90 is at zero. Eventually, before the eighth SPO, all data from $1^{st}$ SLC SB 65 is copied to MLC SB 90. However, $1^{st}$ SLC SB 65 cannot be invalidated because MLC SB 90 is still open.

Thus, with reference to FIG. 10, the current state of the SBs is as follows. Data having an SLC version and an MLC version is contained pages 92a-92e of all blocks of MLC SB 90 and in all pages of all blocks of the $1^{st}$ SLC SB 65. Each of $2^{nd}$ and $3^{rd}$ SLBs 80 and 85 has the same state as in FIG. 9.

Continuing with the same sequence of actions between the FTL 135 and the host at the end of RTI after the tenth SPO, MLC SB 90 is full and can be closed. Hence, $1^{st}$ and $2^{nd}$ SLC SBs 65 and 80 respectively can be erased. In the states shown in FIG. 11, all pages of all blocks of MLC SB 90, $1^{st}$ SLC SB 65 and $2^{nd}$ SLC SB 80 contain data having both an SLC version and an MLC version. $3^{rd}$ SLC SB 85 has changed relative to its state in FIG. 10 in that pages 87f and 87g in blocks 86a-86d now contain host data.

Finally, at the end RTI after the twelfth SPO, almost all data from $3^{rd}$ SLC SB 85 has been copied to MLC SBs including another MLC SB 95 also not determined to be a UB. With reference to FIG. 12, data having both an MLC version and an SLC version is in pages 97a-97d of blocks 96a-96d of MLC SB 95, but the remaining pages 97e-97j of all blocks thereof are empty. In $3^{rd}$ SLC SB 85, pages 87a-87h of blocks 86a-86d contain data having both an MLC version and an SLC version, while page 87i of all blocks contains host data and page 87j of all blocks is empty.

At this stage, the remainder of the data from $3^{rd}$ SLC SB 85 can be copied to MLC SB 95, bypassing the GC trigger and throttling policy. In this case, $3^{rd}$ SLC SB 85 can be erased and the FTL 135 allows host read operations from the non-closed MLC SB 95. If SPO occurs again the FTL 135 may mark MLC SB 95 as unsafe and repeat the steps of the GC strategy from the beginning.

The above-described GC strategy is exemplary. It may be modified to meet specific requirements. For example, if the SLC area is limited or not available, it is possible to copy the data from the UBs directly to MLC blocks. In this case, the FTL 135, using read throttling, may enable continued writing to MLC blocks, which have not been closed before SPO, and ensure that they do not reach the read disturb threshold.

If QoS requirements are flexible, it is possible to increase RTI after a certain number of sequential SPOs, which is equivalent to an increase of the time of each SPO.

Either of these modifications may be employed individually or they may be combined.

Figure 13:
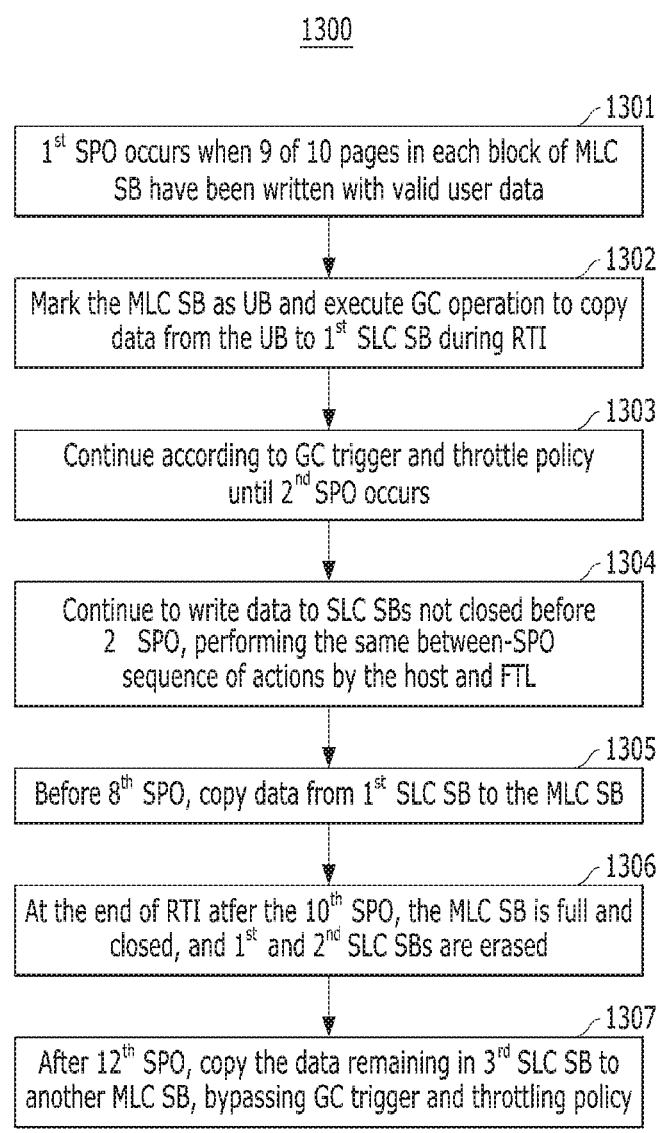
FIG. 13 is a flow chart illustrating steps in processes for executing a GC operation strategy in accordance with embodiments of the present invention.

FIG. 13 is a flow chart describing steps in processes for executing a GC operation strategy, in accordance with embodiments of the present invention. The steps shown in flow chart 1300 are exemplary. Those skilled in the art will understand that additional and/or alternative steps may be performed, or that the order of steps may be changed, to effectuate aspects of the present invention without departing from the inventive concepts disclosed herein.

The following description assumes an SB structure as described in connection with FIG. 4. That is, an SB has four (4) physical blocks, each with 10 (ten) pages. However, it is noted that this structure is merely exemplary; the present invention may be applied to SBs with different numbers of physical blocks and pages therein.

Referring to FIG. 13, along with other figures, at step 1301, a first SPO occurs at a time when 9 of the 10 pages in each block of an MLC SB have been written to with valid user data. The last page in each block of the MLC SB remains empty. This state is shown in FIG. 5.

After power-on following the first SPO, at step 1302, the MLC SB is marked as an unsafe block (UB) and a GC operation is executed to copy data from the UB to a $1^{st}$ SLC SB during RTI. The states of the UB and the $1^{st}$ SLC SB, as well as the associated conditions, at the end of RTI after the first SPO are as shown and described in connection with FIG. 6.

At step 1303, the process continues in accordance with the GC trigger and throttling policy previously described in connection with FIG. 7 until a second SPO occurs. The states of the UB and the $1^{st}$ SLC SB before the second SPO are as shown and described with respect to FIG. 7.

After power-on following the second SPO, at step 1304 the process continues to write data to SLC SBs that were not closed before the second SPO, performing the same sequence of actions, among the FTL and the host, as between the first and second SPOs, which is the same as those to be performed between future adjacent SPOs. At the end of RTI after the fifth SPO, the states of the SBs, including the UB and $1^{st}$ SLC SB, as well as $2^{nd}$ and $3^{rd}$ SLC SBs, are as shown and described with respect to FIG. 8.

The UB now contains only valid data; hence, it can be and is erased. This means that the first general step of the GC operation strategy, which entails copying data from UBs to SLC SBs, is complete. Thus, the process continues with the second general step of copying data from the SLC SBs to new MLC SBs. In an embodiment, the $1^{st}$ SLC SB, among the SLC SBs, is processed first. According to embodiments of the present invention, data copied to a new MLC SB still has a valid SLC version that is used to satisfy host read requests. Data in the SLC SBs is invalidated only when a new MLC SB is closed.

Continuing with the between-SPOs sequence of actions, the states of the SBs before the sixth SPO are as shown and described in connection with FIG. 9.

After the sixth SPO, the process continues by writing data into the new MLC SB (shown in FIG. 9) because the process ensures that the read of the new MLC SB is zero. Eventually, before the eighth SPO, at step 1305 the data from the $1^{st}$ SLC SB is copied to the new MLC SB, but the $1^{st}$ SLC SB cannot be invalidated because the new MLC SB is still open. The states of the SBs are as shown and described with respect to FIG. 10.

The process continues with the same between-SPO sequence of actions. At the end of RTI after the tenth SPO, at step 1306, the MLC SB is full and is closed, and as a result, the $1^{st}$ and $2^{nd}$ SLC SBs are erased. The states of the SBs are as shown and described in connection with FIG. 11.

Then, at the end of RTI after the twelfth SPO, almost all of the data from the $3^{rd}$ SLC SB has been copied to MLC SBs including another MLC SB also not determined as a UB. At this point, represented by step 1307, the remainder of the data is copied from the $3^{rd}$ SLC SB to the new MLC SB, bypassing the GC trigger and throttling policy. In this case, the $3^{rd}$ SLC SB is erased and host read operations from the non-closed MLC SB are permitted.

If another SPO occurs, the process repeats, returning to step 1301.

As the foregoing demonstrates, embodiments of the present invention provide an improved GC operation strategy that is particularly effective in the case of the occurrence of multiple SPOs. The inventive GC operation strategy is able to accommodate different situations, e.g., limited or no SLC area, and may be modified according to flexible QoS requirements. The GC operation strategy, in accordance with embodiments of the present invention, advantageously ensures data consistency and meets system requirements in case of multiple SPOs.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive.

What is claimed is:

1. A memory system, comprising:
   a memory device including single-level cell (SLC) memory blocks and multi-level cell (MLC) memory blocks, each of the SLC and MLC memory blocks including pages, at least some of the SLC memory blocks being grouped into super blocks (SLC SBs) and at least some of the MLC memory blocks being grouped into super blocks (MLC SBs); and
   a memory controller configured to execute a flash translation layer (FTL) to perform operations including a garbage collection (GC) operation,
   wherein the memory controller executes the GC operation after a sudden power off (SPO) by determining each MLC SB with user data opened before the SPO to be an unsafe super block (UB), copying data from pages in a select one of the UBs to pages in select two SLC SBs of the SLC SBs, and copying the data from the pages in the select two SLC SBs to pages in a select MLC SB not determined to be a UB, and
   after an $n^{th}$ one of the subsequent SPOs, where n is greater than m, when the select MLC SB is full, the select MLC SB is closed and the select two SLC SBs from which the data of the select MLC SB was copied are erased.

2. The memory system of claim 1, wherein, during the GC operation, new data received by the memory system from an external source is written to pages in the SLC SBs.

3. The memory system of claim 1, wherein, during a rebuild time interval (RTI) from power-on after the SPO, the memory controller loads and recovers critical metadata previously stored in the SLC memory blocks.

4. The memory system of claim 3, wherein the memory controller continues to execute the GC operation after each of multiple subsequent SPOs to copy all data from all pages in the select UB to pages to pages in the SLC SBs.

5. The memory system of claim 1, wherein, during copying data from the pages in the SLC SBs to pages in the select MLC SB, the memory controller manages free space for new externally-received data using GC throttling.

6. The memory system of claim 1, wherein, during execution of the GC operation, the memory controller does not allow data to be read from open MLC memory blocks, among the MLC memory blocks.

7. The memory system of claim 6, wherein the memory controller continues copying data from the pages in the SLC SBs to pages in the select MLC SB during execution of the GC operation after each of subsequent multiple SPOs.

8. The memory system of claim 4, wherein, after an $m^{th}$ one of the subsequent SPOs, when the select UB contains only invalid data, the memory controller erases the select UB.

9. The memory system of claim 1, wherein the memory system is a flash-based memory system.

10. A method of performing a garbage collection (GC) operation on a memory system that includes a memory device including single-level cell (SLC) memory blocks and multi-level cell (MLC) memory blocks, each of the SLC and MLC memory blocks including pages, at least some of the SLC memory blocks being grouped into SLC super blocks (SBs) and at least some of the MLC memory blocks being grouped into MLC SBs, the method comprising:

determining each MLC SB with user data opened before a first sudden power off (SPO) of multiple SPOs to be an unsafe SB (UB);

copying data from pages in a select one of the UBs to pages in select two SLC SBs of the SLC SBs during each of multiple rebuild time intervals (RTIs) after the first and subsequent SPOs respectively until the select UB contains only invalid data, each RTI being a set time starting from a power-on following the corresponding SPO;

erasing the invalid data in the select UB;

copying the data from the pages in the select two SLC SBs, to which data was copied from the select UB, to pages in a select MLC SB not determined to be a UB until the select MLC SB is full;

closing the select MLC SB when the select MLC SB is full; and erasing the select two SLC SBs from which the data of the select MLC SB was copied.

11. The method of claim 10, further comprising:

continuing to copy data of non-erased SLC SBs, to which data was copied from the select UB, into a new MLC SB.

12. The method of claim 11, wherein, the continuing to copy is performed by bypassing a GC trigger and throttling policy of the memory system.

13. The method of claim 10, wherein, while performing the GC operation, new data received by the memory system from an external source is written to pages in the SLC SBs.

14. The method of claim 10, wherein the copying of data from pages in a select one of the UBs to pages in at least some of the SLC SBs is performed during a first RTI of the multiple RTIs according to a GC trigger and throttle policy of the memory system until a first of the subsequent SPOs occurs.

15. The method of claim 10, further comprising:

managing free space for new externally-received data using GC throttling, during the copying of data from the pages in the SLC SBs.

16. The method of claim 10, wherein, while performing the GC operation, the memory controller does not allow data to be read from open MLC memory blocks, among the MLC memory blocks.

17. The method of claim 10, wherein the memory system is a flash-based memory system.

* * * * *